(12) United States Patent
Lee et al.

(10) Patent No.: US 9,385,030 B2
(45) Date of Patent: Jul. 5, 2016

(54) SPACER TO PREVENT SOURCE-DRAIN CONTACT ENCROACHMENT

(71) Applicant: GLOBALFOUNDRIES Inc., Grand Cayman (KY)

(72) Inventors: Yong M. Lee, Mechanicville, NY (US); Yue Hu, Mechanicville, NY (US); Wen-Pin Peng, Clifton Park, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 57 days.

(21) Appl. No.: 14/265,536

(22) Filed: Apr. 30, 2014

(65) Prior Publication Data

US 2015/0318204 A1 Nov. 5, 2015

(51) Int. Cl.
*H01L 21/00* (2006.01)
*H01L 21/84* (2006.01)
*H01L 21/768* (2006.01)
*H01L 21/283* (2006.01)
*H01L 29/66* (2006.01)
*H01L 29/417* (2006.01)

(52) U.S. Cl.
CPC ........ *H01L 21/76831* (2013.01); *H01L 21/283* (2013.01); *H01L 21/76802* (2013.01); *H01L 29/41775* (2013.01); *H01L 29/66545* (2013.01)

(58) Field of Classification Search
CPC .................................................. H01L 21/7682
USPC ........................................................ 438/152
See application file for complete search history.

(56) References Cited

U.S. PATENT DOCUMENTS

| 5,942,446 | A | * | 8/1999 | Chen et al. ..................... 438/734 |
| 8,138,097 | B1 | * | 3/2012 | Isobayashi .......... H01L 21/0332 257/E21.231 |
| 8,741,723 | B2 | * | 6/2014 | Chi .............................. 438/299 |
| 2004/0072436 | A1 | * | 4/2004 | RamachandraRao et al. ............................ 438/692 |
| 2009/0017636 | A1 | * | 1/2009 | Kumazawa ....... H01L 21/32134 438/745 |
| 2009/0108335 | A1 | * | 4/2009 | Hohage et al. ................ 257/327 |
| 2010/0193963 | A1 | * | 8/2010 | Richter et al. ................ 257/774 |
| 2011/0298061 | A1 | * | 12/2011 | Siddiqui .......... H01L 21/28088 257/410 |
| 2013/0087833 | A1 | * | 4/2013 | Wang ............................ 257/192 |
| 2013/0181273 | A1 | * | 7/2013 | Charpin-Nicolle H01L 21/28273 257/314 |
| 2014/0087540 | A1 | | 3/2014 | Lin et al. |
| 2014/0099773 | A1 | | 4/2014 | Doris et al. |

* cited by examiner

*Primary Examiner* — Matthew Landau
*Assistant Examiner* — Igwe U Anya
(74) *Attorney, Agent, or Firm* — Williams Morgan, P.C.

(57) ABSTRACT

Aspects of the present invention relate to approaches for preventing contact encroachment in a semiconductor device. A first portion of a contact trench can be etched partway to a source-drain region of the semiconductor device. A dielectric liner can be deposited in this trench. A second etch can be performed on the lined trench to etch the contact trench channel the remainder of the way to the source-drain region. This leaves a portion of the dielectric liner remaining in the trench (e.g., covering the vertical walls of the trench) after the second etch.

12 Claims, 12 Drawing Sheets

SPACER TO PREVENT SOURCE-DRAIN CONTACT ENCROACHMENT

BACKGROUND

1. Technical Field

This invention relates generally to the field of semiconductors and, more particularly, to approaches for preventing encroachment of material used to form a contact to a source-drain region.

2. Related Art

During fabrication, semiconductor devices such as field effect transistors (FETs) often include a stage in which a contact is formed to a source-drain region of the semiconductor device. To form a conduit for the contact, a trench must often be formed. This trench can be formed by an etching process with the use of a mask, such as a hardmask. After the etching has been completed, the hardmask is usually removed (e.g., using a chemical strip process). This chemical strip process often utilizes relatively strong chemicals, which can accentuate any defects that may be present in the semiconductor device.

SUMMARY

In general, aspects of the present invention relate to approaches for preventing contact encroachment in a semiconductor device. A first portion of a contact trench can be etched partway to a source-drain region of the semiconductor device. A dielectric liner can be deposited in this trench. A second etch can be performed on the lined trench to etch the contact trench channel the remainder of the way to the source-drain region. This leaves a portion of the dielectric liner remaining in the trench (e.g., covering the vertical walls of the trench) after the second etch.

A first aspect of the present invention provides a method for preventing contact encroachment in a semiconductor device, comprising: etching a first portion of a contact trench to a source-drain region of the semiconductor device; depositing a dielectric liner in the trench; and etching a remainder of the contact trench channel to the source-drain region, wherein at least a portion of the dielectric liner deposited on horizontal walls of the trench remains after the remainder of the contact trench has been formed.

A second aspect of the present invention provides a method for forming a semiconductor device, comprising: forming a source-drain region, a replacement metal gate, and an inter-layer dielectric layer on a substrate; forming a stress nitride encapsulation layer over the replacement metal gate and the inter-layer dielectric layer; detecting a susceptible region for a potential defect in the semiconductor device between the metal gate and the source-drain region; etching a first portion of a contact trench to a source-drain region of the semiconductor device, the first portion of the contact trench extending to a depth that is below the susceptible region and above the source-drain region; depositing a dielectric liner in the trench, wherein a portion of the dielectric liner overlays the susceptible region; and etching a remainder of the contact trench channel to the source-drain region while leaving the portion of the dielectric liner that overlays the susceptible region.

A third aspect of the present invention provides a semiconductor device, formed via a process, comprising: forming a source-drain region, a replacement metal gate, and an inter-layer dielectric layer on a substrate; forming a stress nitride encapsulation layer over the replacement metal gate and the inter-layer dielectric layer; detecting a susceptible region for a potential defect in the semiconductor device between the metal gate and the source-drain region; etching a first portion of a contact trench to a source-drain region of the semiconductor device, the first portion of the contact trench extending to a depth that is below the susceptible region and above the source-drain region; depositing a dielectric liner in the trench, wherein a portion of the dielectric liner overlays the susceptible region; and etching a remainder of the contact trench channel to the source-drain region while leaving the portion of the dielectric liner that overlays the susceptible region.

BRIEF DESCRIPTION OF THE DRAWINGS

These and other features of this invention will be more readily understood from the following detailed description of the various aspects of the invention taken in conjunction with the accompanying drawings in which.

The drawings are not necessarily to scale. The drawings are merely representations, not intended to portray specific parameters of the invention. The drawings are intended to depict only typical embodiments of the invention, and therefore should not be considered as limiting in scope. In the drawings, like numbering represents like elements.

DETAILED DESCRIPTION

Illustrative embodiments will now be described more fully herein with reference to the accompanying drawings, in which embodiments are shown. This disclosure may, however, be embodied in many different forms and should not be construed as limited to the embodiments set forth herein. Rather, these embodiments are provided so that this disclosure will be thorough and complete and will fully convey the scope of this disclosure to those skilled in the art. In the description, details of well-known features and techniques may be omitted to avoid unnecessarily obscuring the presented embodiments.

The terminology used herein is for the purpose of describing particular embodiments only and is not intended to be limiting of this disclosure. As used herein, the singular forms "a", "an", and "the" are intended to include the plural forms as well, unless the context clearly indicates otherwise. Furthermore, the use of the terms "a", "an", etc., do not denote a limitation of quantity, but rather denote the presence of at least one of the referenced items. The term "set" is intended to mean a quantity of at least one. It will be further understood that the terms "comprises" and/or "comprising", or "includes" and/or "including", when used in this specification, specify the presence of stated features, regions, integers, steps, operations, elements, and/or components, but do not preclude the presence or addition of one or more other features, regions, integers, steps, operations, elements, components, and/or groups thereof.

Reference throughout this specification to "one embodiment," "an embodiment," "embodiments," "exemplary embodiments," or similar language means that a particular feature, structure, or characteristic described in connection with the embodiment is included in at least one embodiment of the present invention. Thus, appearances of the phrases "in one embodiment," "in an embodiment," "in embodiments" and similar language throughout this specification may, but do not necessarily, all refer to the same embodiment.

The terms "overlying" or "atop", "positioned on" or "positioned atop", "underlying", "beneath" or "below" mean that a first element, such as a first structure (e.g., a first layer) is present on a second element, such as a second structure (e.g. a second layer) wherein intervening elements, such as an interface structure (e.g. interface layer) may be present between the first element and the second element.

As used herein, "depositing" may include any now known or later developed techniques appropriate for the material to be deposited including but not limited to, for example: chemical vapor deposition (CVD), low-pressure CVD (LPCVD), plasma-improved CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metal-organic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation, etc.

As indicated above, aspects of the present invention relate to approaches for preventing contact encroachment in a semiconductor device. A first portion of a contact trench can be etched partway to a source-drain region of the semiconductor device. A dielectric liner can be deposited in this trench. A second etch can be performed on the lined trench to etch the contact trench channel the remainder of the way to the source-drain region. This leaves a portion of the dielectric liner remaining in the trench (e.g., covering the vertical walls of the trench) after the second etch.

Figure 1:
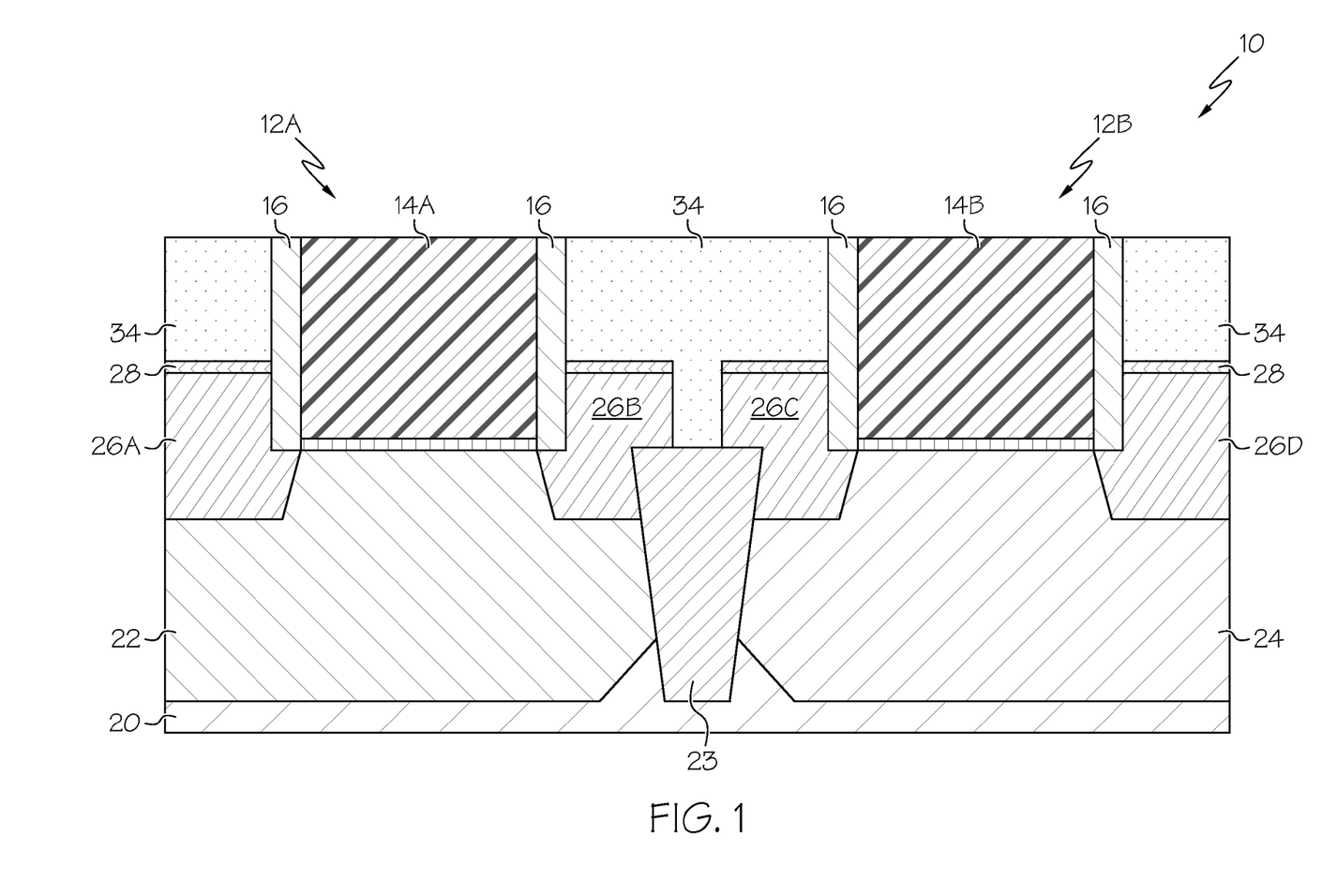
FIG. 1 shows a semiconductor device according to an embodiment of the present invention.

Referring now to FIG. 1, a cross-sectional view of a semiconductor device 10 according to an embodiment of the present invention is shown. As depicted, device 10 may include a set of gate stacks 12A-B formed over a substrate 20. Gate stacks 12A-B may include dummy gates 14A-B (e.g., poly silicon, SiOC, SiOCN, and/or the like), spacers 16 and/or liner layer (not shown).

The term "substrate" as used herein is intended to include a semiconductor substrate, a semiconductor epitaxial layer deposited or otherwise formed on a semiconductor substrate and/or any other type of semiconductor body, and all such structures are contemplated as falling within the scope of the present invention. For example, the semiconductor substrate may comprise a semiconductor wafer (e.g., silicon, SiGe, or an SOI wafer) or one or more die on a wafer, and any epitaxial layers or other type semiconductor layers formed thereover or associated therewith. A portion or entire semiconductor substrate may be amorphous, polycrystalline, or single-crystalline. In addition to the aforementioned types of semiconductor substrates, the semiconductor substrate employed in the present invention may also comprise a hybrid oriented (HOT) semiconductor substrate in which the HOT substrate has surface regions of different crystallographic orientation. The semiconductor substrate may be doped, undoped, or contain doped regions and undoped regions therein. The semiconductor substrate may contain regions with strain and regions without strain therein, or contain regions of tensile strain and compressive strain.

As further shown, device 10 may include NFET region 22, PFET region 24, isolation region 23, raised source-drain (RSDs) 26A-D, which can include one or more phosphorus silicon (SiP) regions, one or more silicon germanium (SiGe) regions and/or the like. It is understood that the specifying of portions of RSD 26A-D in accordance with use of certain materials (e.g., SiP and SiGe) should not be seen as limiting, but, rather, use of any materials now known or later developed as being adapted for use in RSDs 26A-D is envisioned. As further shown in FIG. 1, an inter-layer dielectric (ILD) 34 can also be deposited over semiconductor device 10 (e.g., over gate stacks 12A, 12B, RSDs 26A-D, etc.) and polished (e.g., via chemical-mechanical polishing (CMP)). It is understood that these layers/components are intended to be illustrative only and that other layers and/or materials may exist in device 10.

Figure 2:
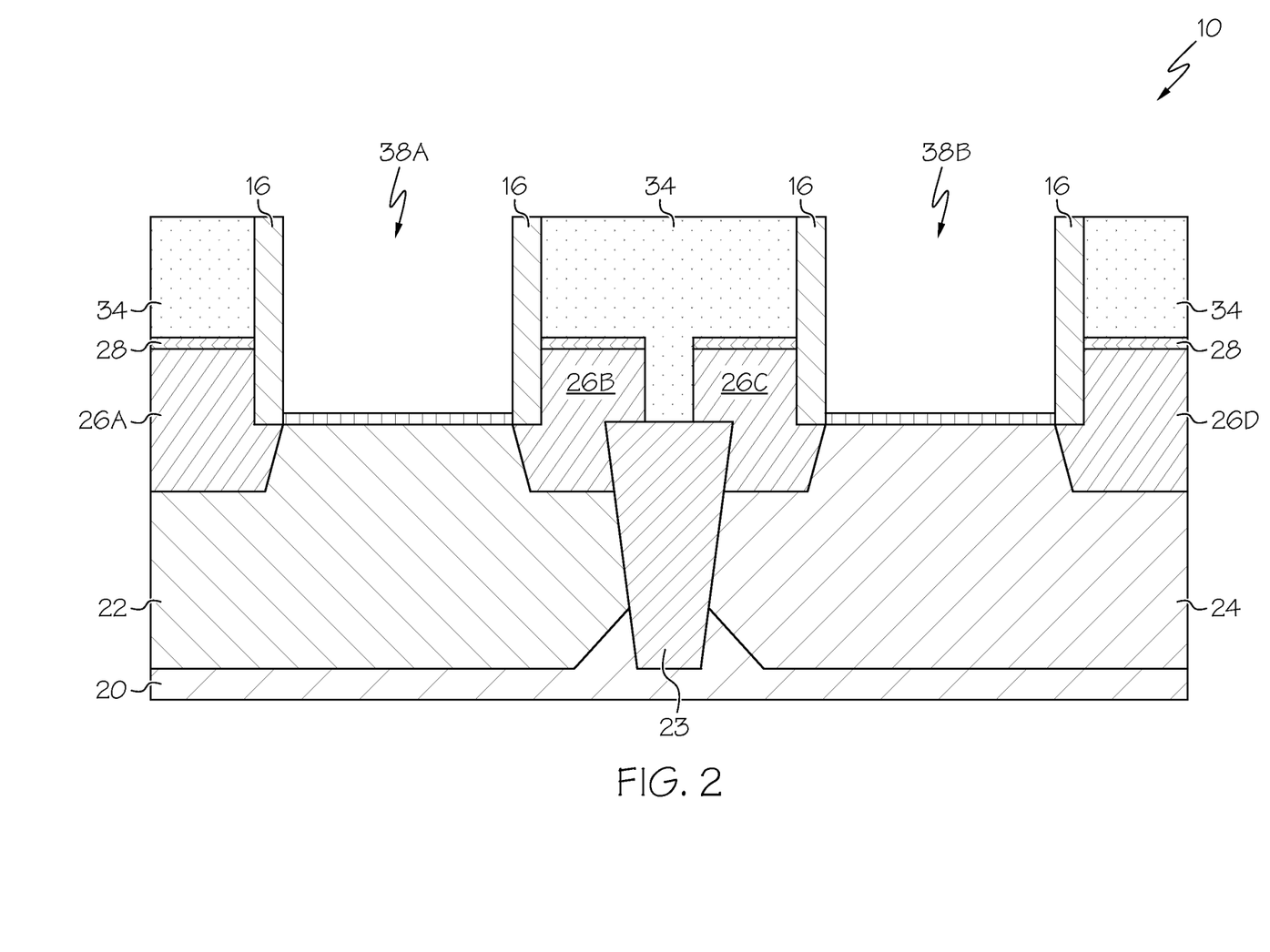
FIG. 2 shows a removal of dummy gates from the gate stacks of the device of FIG. 1 according to an embodiment of the present invention.

Referring now to FIG. 2, dummy gates (14A-B) can be removed from semiconductor device 10, leaving spacers 16 and ILD 34 forming gate region/areas 38A-B (hereafter "recess"). The forming gate region/areas 38A-B is bounded by spacers 16.

Figure 3:
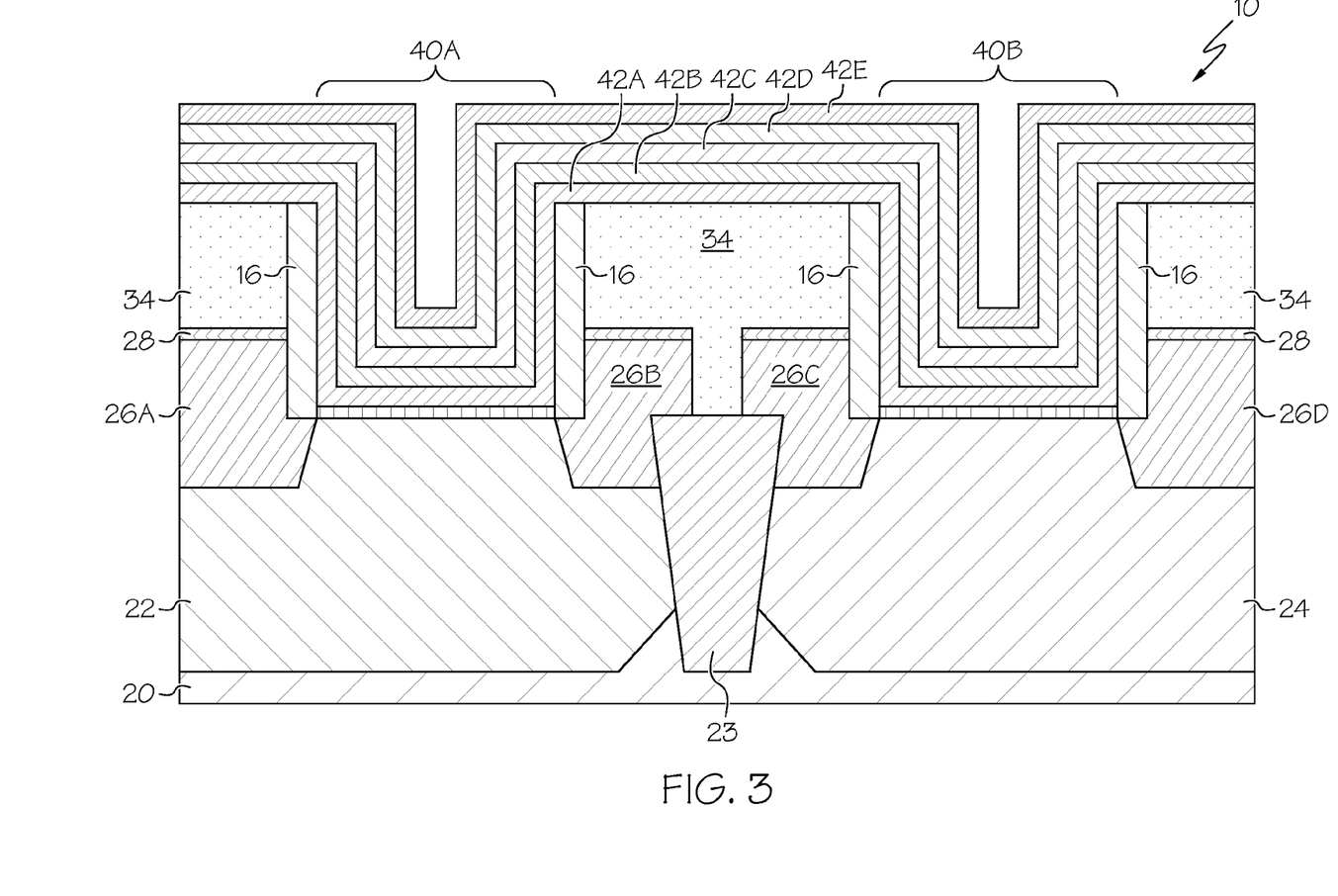
FIG. 3 shows a deposit of a gate to the device of FIG. 2 according to an embodiment of the present invention.

Then, as shown in FIG. 3, a set of gates (40A-B) can be formed in forming gate region/areas 38A-B of semiconductor device 10. As shown, gates 40A-B can be replacement metal gates and can be formed by depositing a series of gate material layers 42A-E. Such a set of gate materials 42A-E can include an oxide stack 42A, including, but not limited to, Hafnium Oxide, covered by one or more work-function metal layers 42B-E, which can include, but not be limited to: Ti, TiN, Ta, TaN, TiAl, Al, TiC, W, and/or the like. Additionally or in the alternative, any other solution now known or later discovered can be utilized (e.g., a metal gate of a single uniform substance). In any event, the portion of the gates 40A-B within forming gate region/areas 38A-B is bounded by spacers 16.

Figure 4:
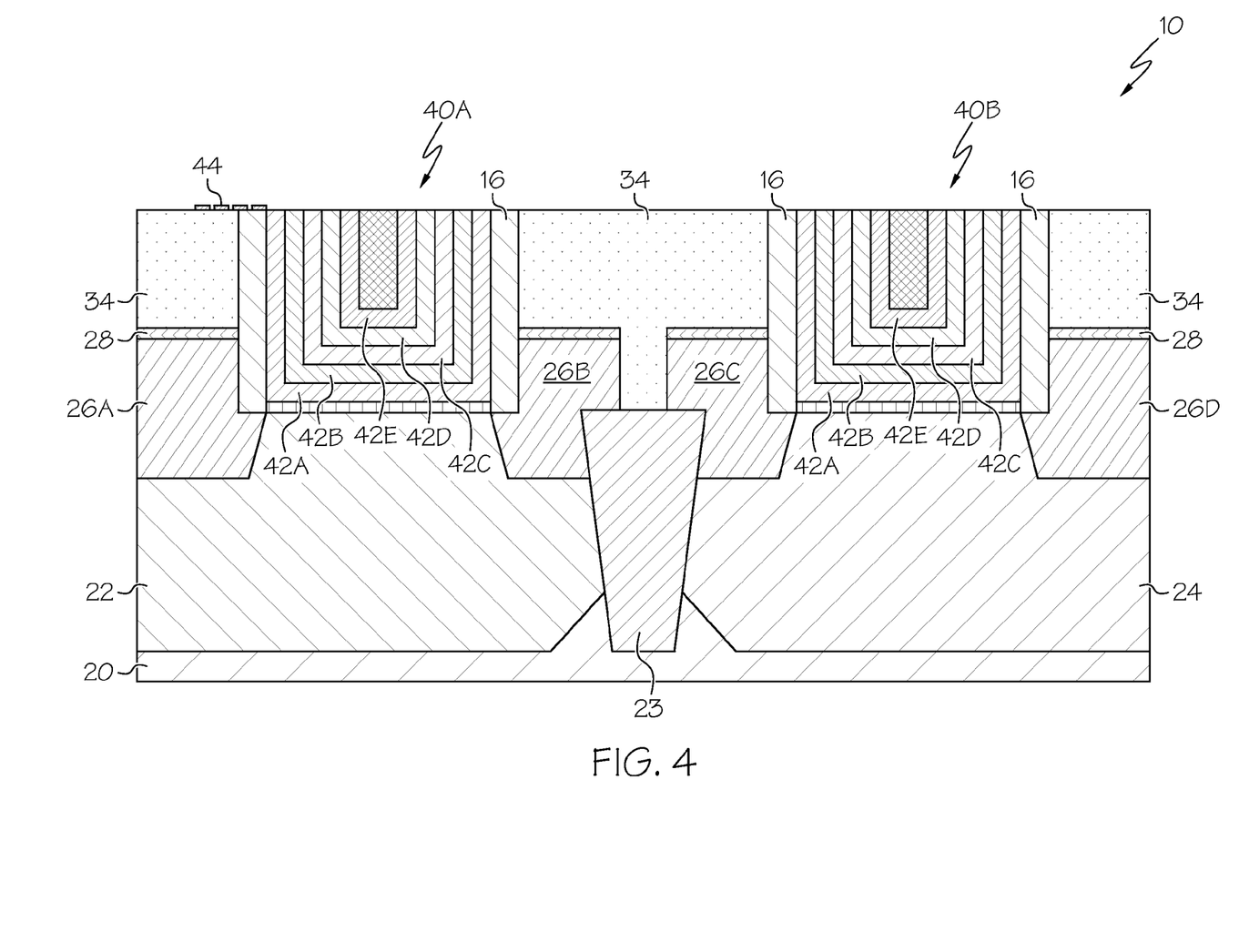
FIG. 4 shows a removal of excess gate material from the device of FIG. 3 according to an embodiment of the present invention.

As shown in FIG. 4, any material that forms the gates 40A-B can then be removed, if necessary, from spacers 16 and ILD 34 (e.g., by reactive ion etch (RIE), CMP, etc.). This removal can leave the metal forming gates 40A-B relatively level with or recessed with respect to an upper surface of ILD 34.

Figure 5:
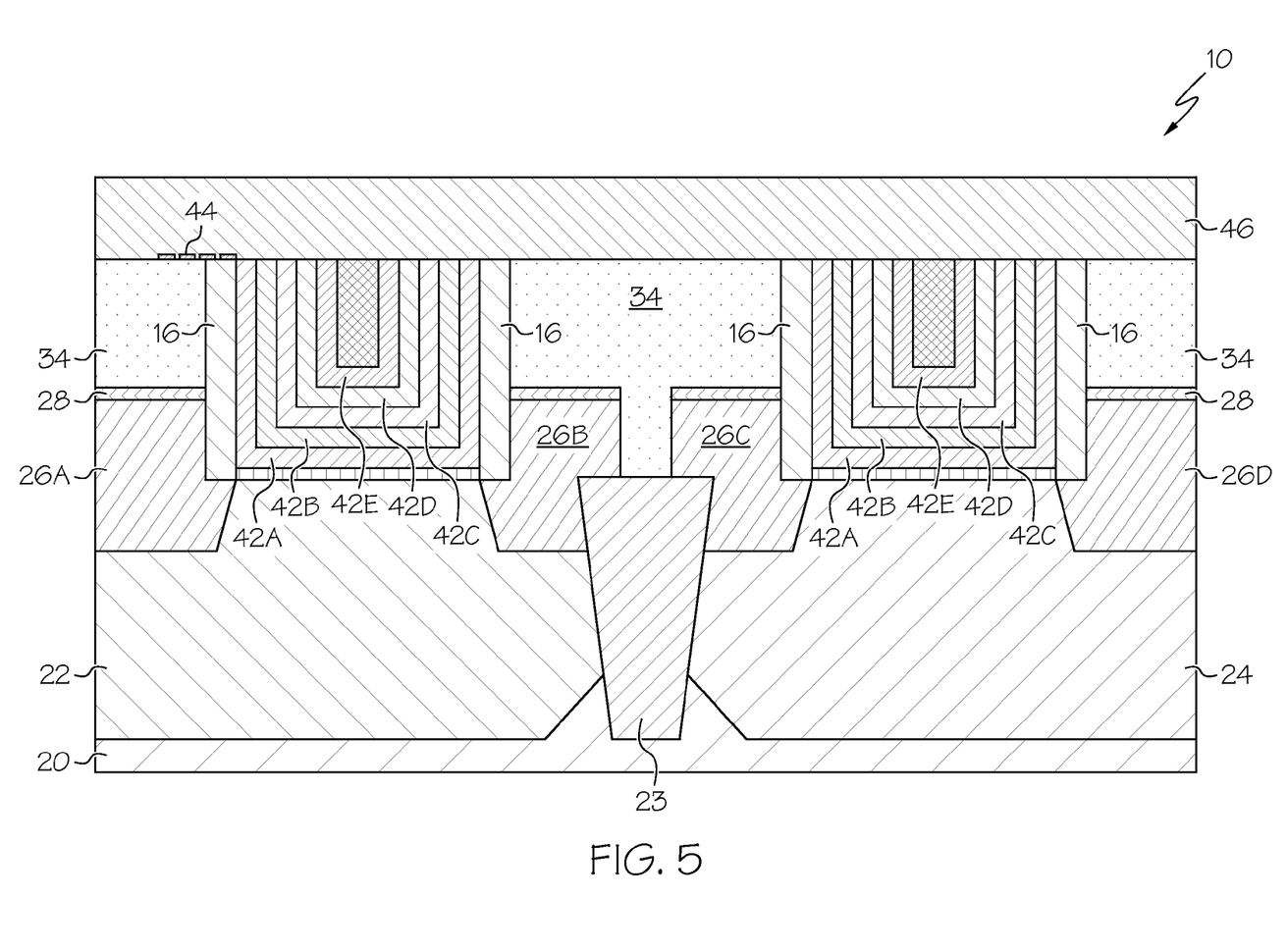
FIG. 5 shows a forming of an encapsulation layer to the device of FIG. 4 according to an embodiment of the present invention.

Referring now to FIG. 5, an encapsulation layer 46 can be formed over semiconductor device 10. Encapsulation layer 46 can cover gates 40A-B, spacers 16, and ILD 34. Encapsulation layer 46 can be prepared by PVD, CVD, spin coating, etc., depending on the material and/or using any process now known or later developed. In an embodiment, encapsulation layer 46 can include a stressed nitride. Alternatively, any substance now known or later developed for forming an encapsulation layer 46 is envisioned, including, but not limited to: silicon nitride (SiN), silicon dioxide (SiO2), silicon oxynitride (SiON), silicon oxycarbide (SiOC), and/or the like.

Figure 6:
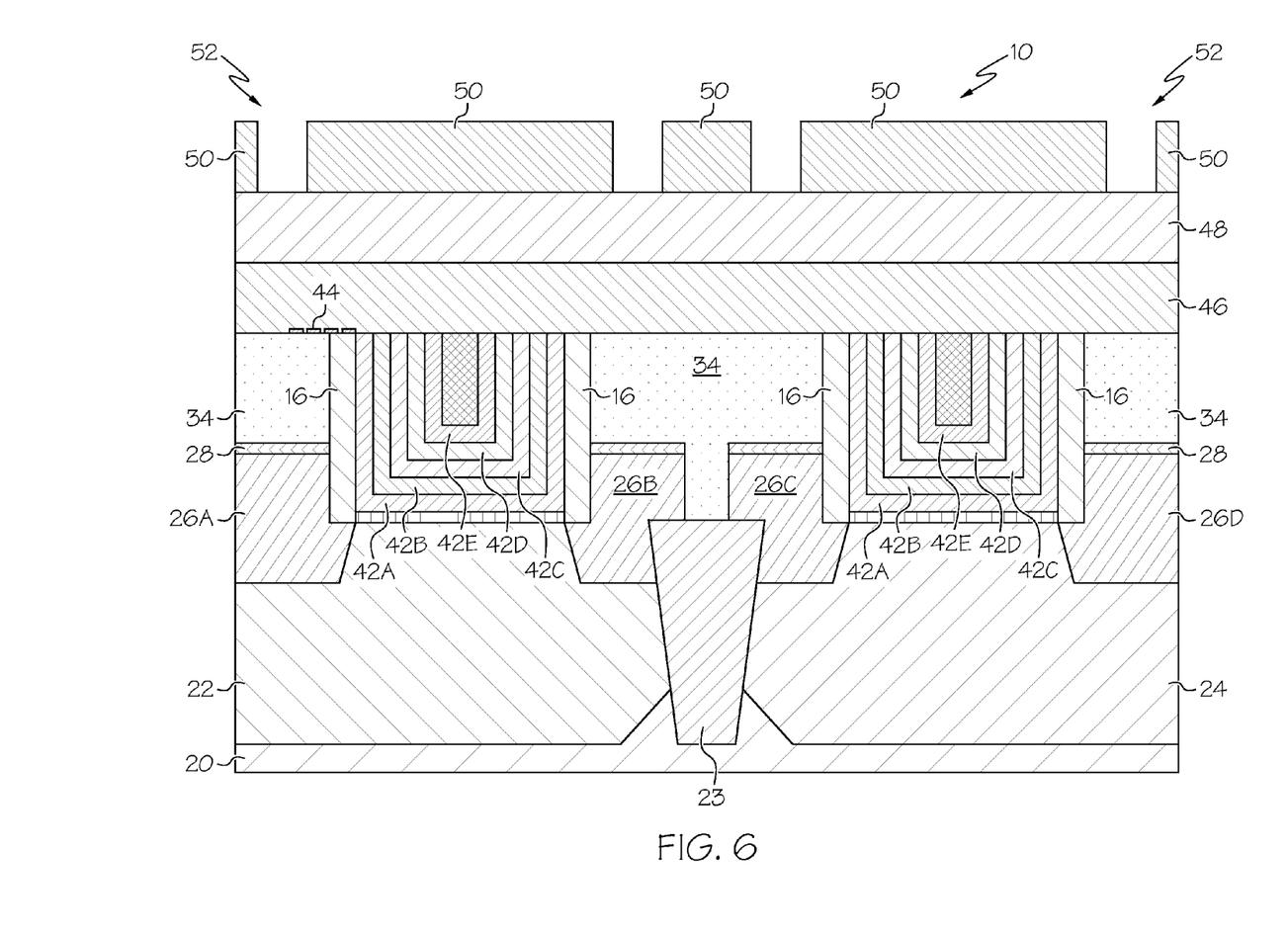
FIG. 6 shows a forming of an oxide layer and a hardmask layer to the device of FIG. 5 according to an embodiment of the present invention.

Then, as shown in FIG. 6, an (optional) patterning sacrificial layer 48 is deposited over encapsulation layer 46. In one embodiment, patterning sacrificial layer 48 can comprise silicon dioxide (SiO2), silicon oxynitride (SiON), silicon oxycarbide (SiOC), and/or any other suitable material(s). Patterning sacrificial layer 48 can be prepared by PVD, CVD, spin coating, etc., depending on the material. Then or alternatively, a hardmask layer 50 is deposited over semiconductor device 10. Hardmask layer 50 can be applied to a surface of patterning sacrificial layer 48, if present, or encapsulation layer 46 if not. In any case, hardmask layer 50 can be patterned to have one or more openings 52 (e.g., over source-drain regions RSDs 26A-D). In an embodiment, hardmask layer 50 can comprise titanium nitride (TiN). However, other types of hardmasks and/or other processes for depositing hardmask layer 50 now known or later developed can be used.

Figure 7:
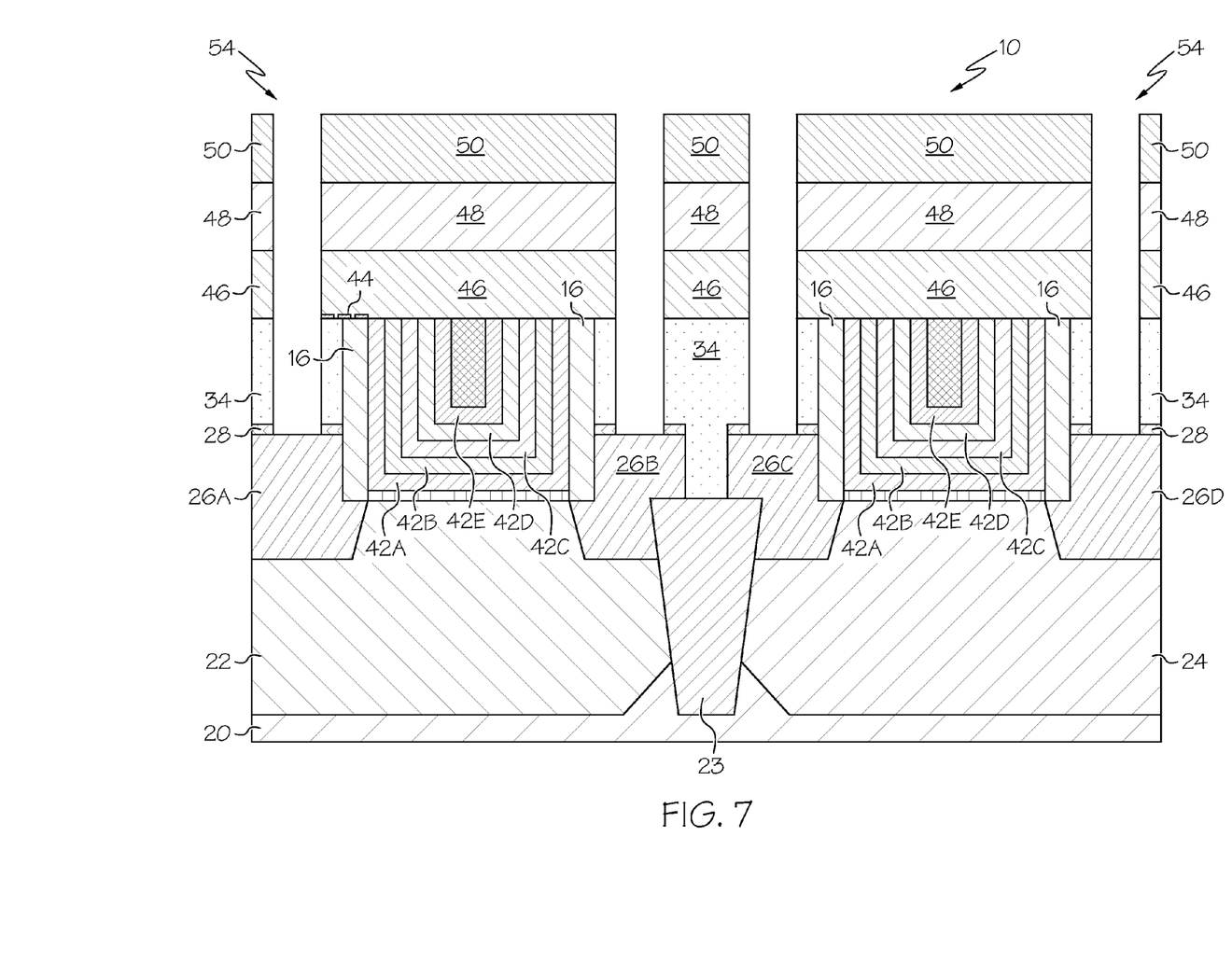
FIG. 7 shows an etching of a trench to a source-drain region of the device of FIG. 6 according to a prior art embodiment.

Currently, as shown in FIG. 7, a contact trench 54 is usually formed to RSD 26A-D, using hardmask layer 50 as a guide. This contact trench 54 is usually formed in a single uninterrupted process or series of processes that etch through patterning sacrificial layer 48, if present, through encapsulation layer 46, through IDL 34, and through spacer 28, if present, to RSD 26A-D. Then, hardmask layer 50 is usually removed using a chemical hardmask strip or using any process now known or later developed.

The inventors of the current invention have discovered that the processes described heretofore can result in a susceptible region 44 for a potential defect in semiconductor device 10. For example, if gate material layers 42A-E (FIG. 3) of metal gate 40A-B are not adequately planarized, a residue of material from formation of the metal gate 40A-B can remain in the susceptible region. Then, when contact trench 54 has been formed and hardmask layer 50 is being removed, the substance used to remove hardmask layer 50 may also remove the residue, leaving an opening in susceptible region 44. Additionally or in the alternative, differences in composition between encapsulation layer 46 (e.g., comprising a stressed material) and IDL 34 (e.g., being non-stressed) can cause an interface flaw in susceptible region 44 (e.g., between the two layers). Similar to the residue described above, this interface flaw can be accentuated by the action within the susceptible region 44 of the substance used to remove hardmask layer 50, leaving an opening in susceptible region 44. Then, when the contact is formed, the material used to form the contact can encroach into the opening in susceptible region 44. This can lead to performance issues in the semiconductor device 10, including shorts (e.g., between RSD 26A-D and metal gate 40A-B), altered metal gate 40A-B work function, and/or the like.

Figure 8:
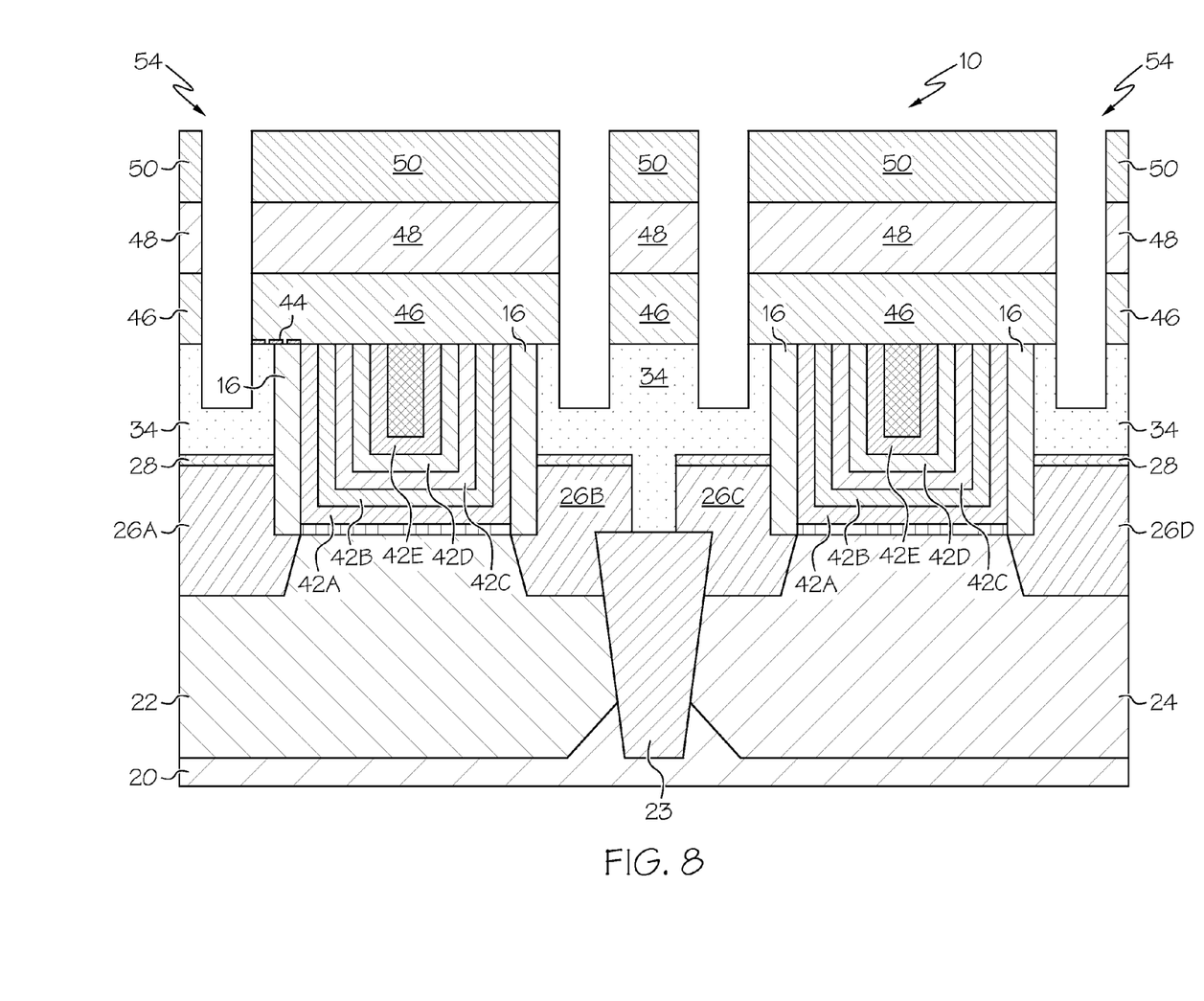
FIG. 8 shows an etching of a first portion of a trench to a source-drain region of the device of FIG. 6 according to an embodiment of the present invention.

Referring now to FIG. 8, an alternate process for forming a contact trench 54 such that contact encroachment is minimized or prevented is shown. In this process, the contact trench 54 is formed in stages. For example, a first portion of contact trench 54 to RSD 26A-D of semiconductor device 10 can be etched. As shown, this first portion of contact trench 54 extends to a depth that is below that of susceptible region 44. However, this first portion of contact trench 54 does not extend entirely to RSD 26A-D. This first portion of contact trench 54 can be formed by an etch, such as a CD chemical etch using an ultra-dilute sulfur phosphate, or the like. For example, in an embodiment, the etch etches through the patterning sacrificial layer 48, through encapsulation layer 46, and partially, but not fully, though IDL 34. The result is that susceptible region 44 is exposed, while further etching must occur before the RSD 26A-D is reached.

Figure 9:
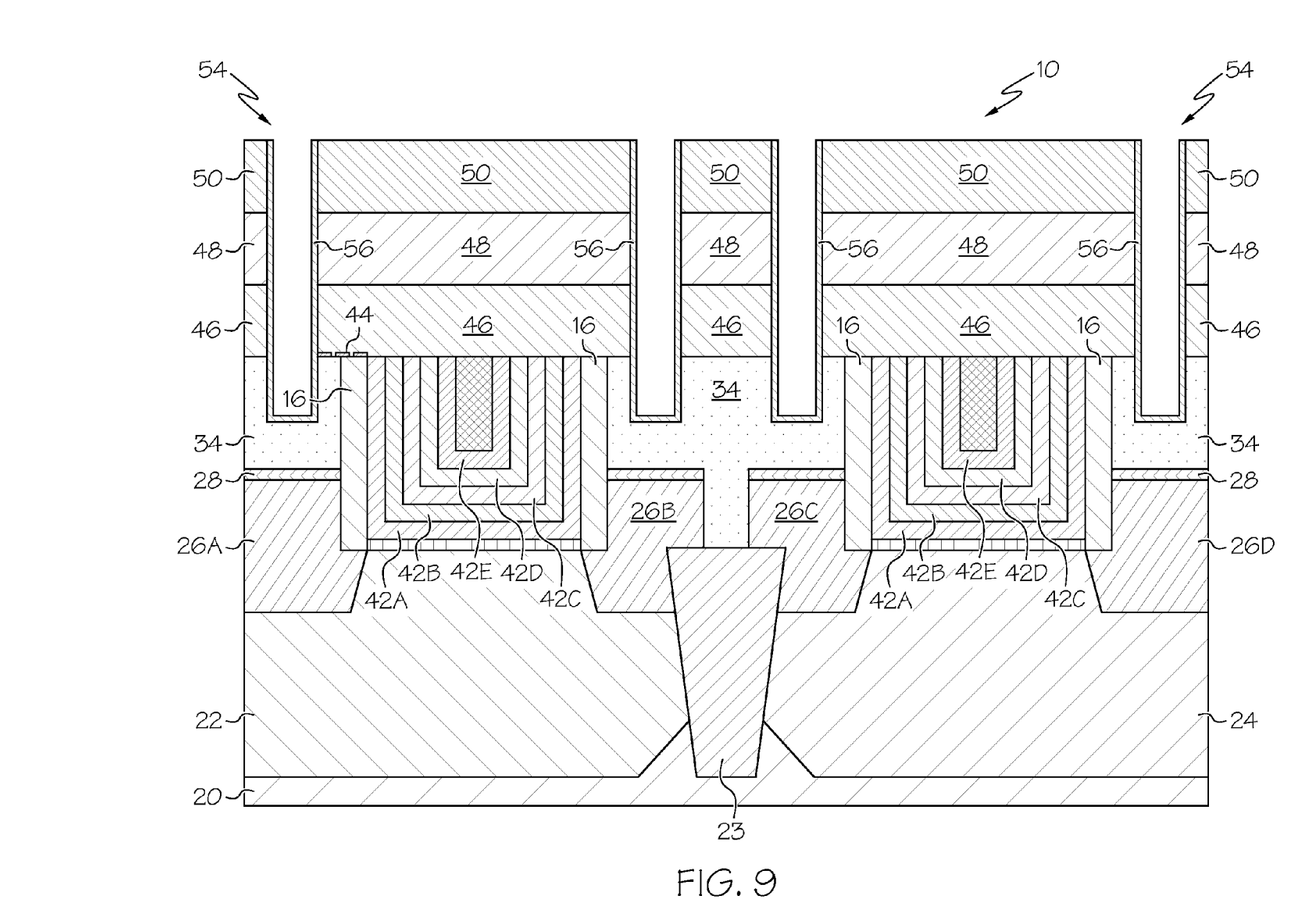
FIG. 9 shows a forming of a dielectric liner in the trench in the device of FIG. 8 according to an embodiment of the present invention.

Then, as shown in FIG. 9, a dielectric liner 56 is deposited in contact trench 54. As illustrated, dielectric liner 56 covers the horizontal walls of contact trench 54, including covering the susceptible region 44 for the potential defect. In addition, dielectric liner 56 can cover the bottom of contact trench 54. In an embodiment, dielectric liner 56 is conformal (e.g., forming a coating that conforms to the interior of contact trench 54). In any case, dielectric liner 56 comprises a substance that is resistant to the substance that will later be used to strip hardmask layer 50. To this extent, dielectric liner 56 can be formed using: silicon carbon oxide, silicon nitride, silicon oxide, and/or any substance now known or later developed. Further, dielectric liner 56 can be applied using any process now known or later developed for applying a liner.

Figure 10:
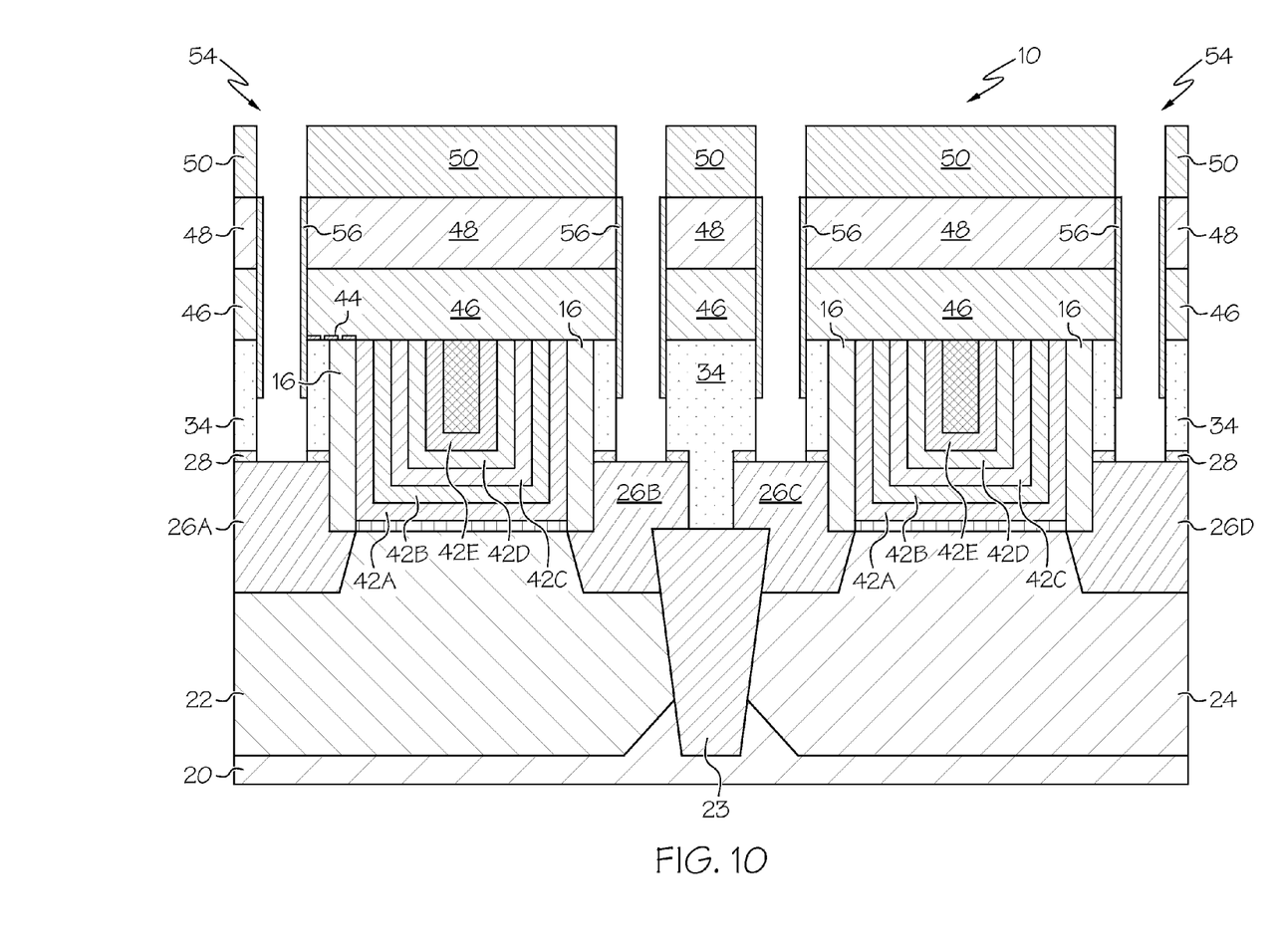
FIG. 10 shows an etching of a remainder of the trench to the source-drain region of the device of FIG. 11 according to an embodiment of the present invention.

Then, as shown in FIG. 10, a remainder of contact trench 54 can be etched to RSD 26A-D semiconductor device 10 according to an embodiment. This etching can remove any portion of liner 56 covering the bottom of contact trench 54, the remaining portion of IDL 34 that was left subsequent to formation of the first portion of contact trench 54, and liner 28 to reach RSD 26A-D. To this extent, the remainder of contact trench 54 can be formed using a blanket etch and/or using any other solution now known or later developed for forming a contact trench 54. Note that although portions (e.g., those portions covering the bottom and/or covering the top portion of the walls of contact trench) of dielectric liner 56 may be removed by this etch, the portion of dielectric liner 54 deposited on horizontal walls of contact trench 54 that covers the susceptible region 44 remains after the etch has been completed and the remainder of the contact trench 54 to RSD 26A-D has been fully formed.

Figure 11:
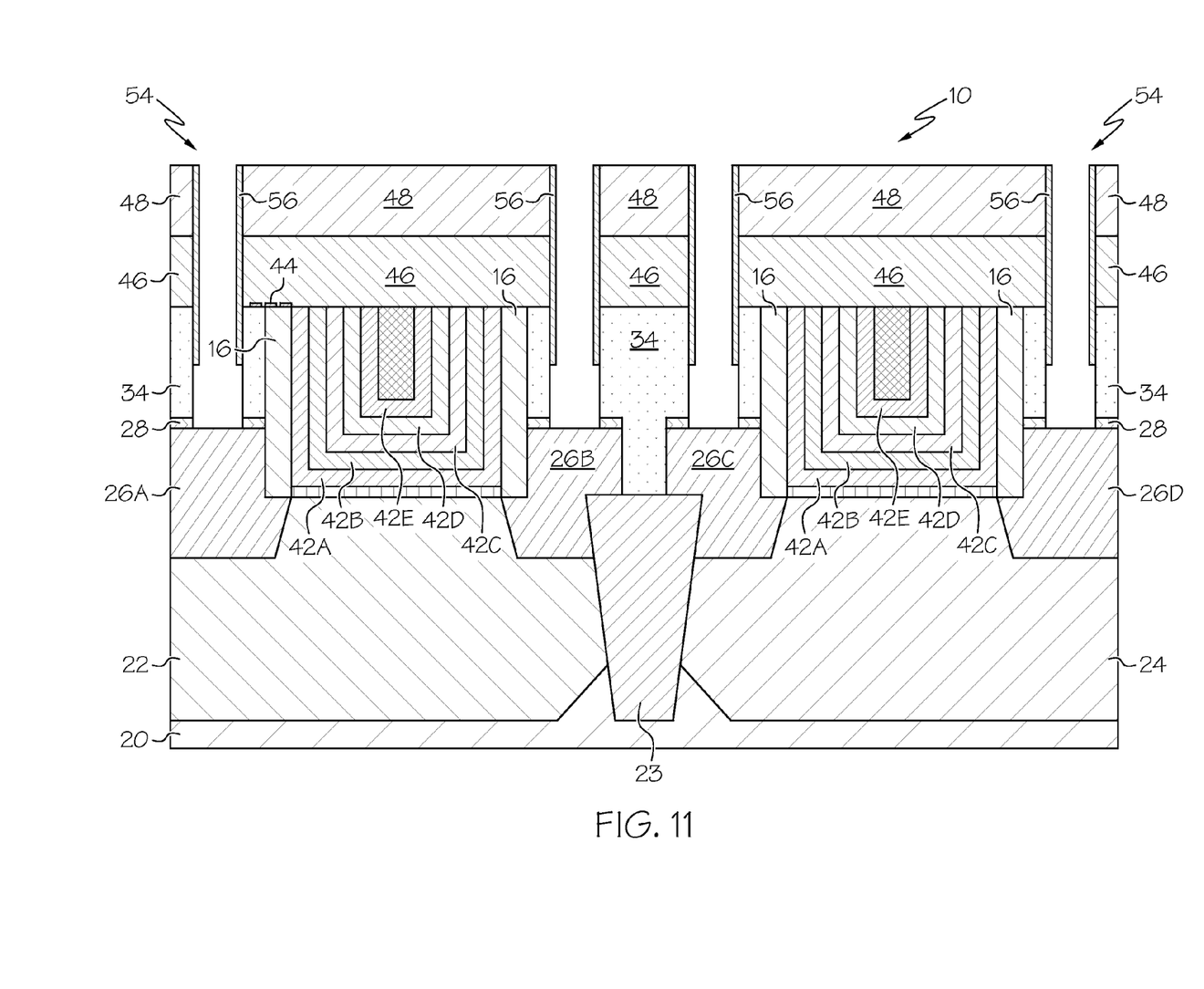
FIG. 11 shows a removal of the hardmask layer from the device of FIG. 10 according to an embodiment of the present invention.

Then, as shown in FIG. 11, hardmask layer 50 (FIG. 10) can be removed from semiconductor device 10. This removal can be performed using a chemical hardmask strip or using any process now known or later developed. In any case, susceptible region 44 is protected from degradation due to any potential defects by the covering dielectric liner 56 over susceptible region 44. This covering provided by dielectric liner 56 prevents any substance used in the removal process from accessing susceptible region 44. This, in turn, can allow the use of more powerful substances in the removal of hardmask layer 50 (FIG. 10). Additionally or in the alternative, options for cleaning out contact trench 54 are also expanded by the protection of susceptible region 44 provided by dielectric liner 56. Further, the multi-stage etch process ensures that only a single etch reaches the RSD 26A-D, reducing the potential for damage to the RSD 26A-D and insuring that the contact formed to the RSD 26A-D has the best possible connective junction.

Figure 12:
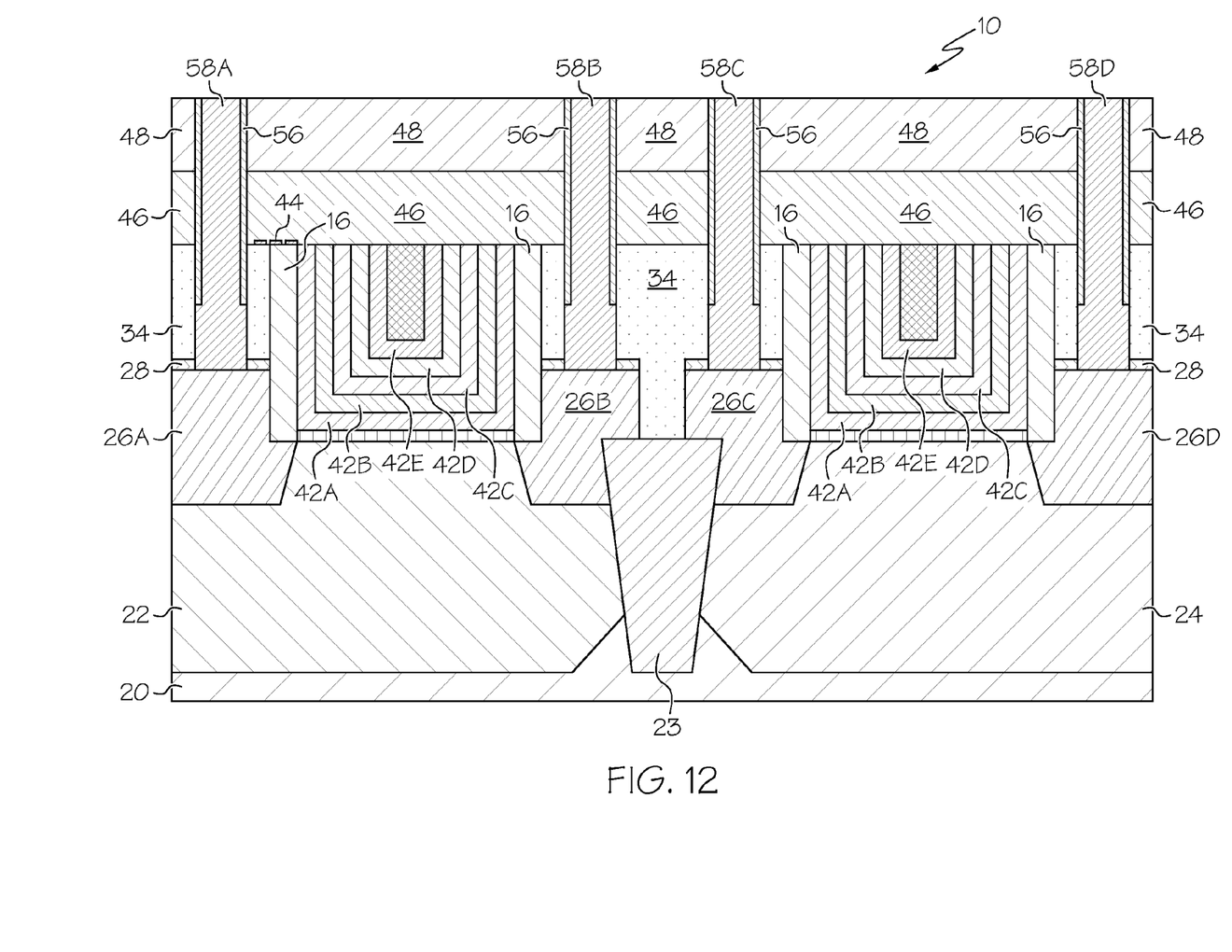
FIG. 12 shows a forming of a contact to the source-drain region in the trench in the device of FIG. 11 according to an embodiment of the present invention.

Referring now to FIG. 12, a set of contacts 58A-D can be formed to RSD 26A-B in trench 54 (FIG. 11). Contacts 58A-D can comprise tungsten and/or any other substance used to form contacts and can be formed using any solution now known or later discovered. Note that the portion of dielectric liner 54 deposited on horizontal walls of the contact trench that covers the susceptible region 44 remains as the contacts 58A-D are being formed and after the contacts 58A-D have been formed. This dielectric liner 54 continues to protect susceptible region 44 by minimizing encroachment of the material forming the contacts 58A-D into any potential defects that may be found in susceptible region 44.

In various embodiments, design tools can be provided and configured to create the data sets used to pattern the semiconductor layers as described herein. For example, data sets can be created to generate photomasks used during lithography operations to pattern the layers for structures as described herein. Such design tools can include a collection of one or more modules and can also include hardware, software, or a combination thereof. Thus, for example, a tool can be a collection of one or more software modules, hardware modules, software/hardware modules, or any combination or permutation thereof. As another example, a tool can be a computing device or other appliance on which software runs or in which hardware is implemented. As used herein, a module might be implemented utilizing any form of hardware, software, or a combination thereof. For example, one or more processors, controllers, application-specific integrated circuits (ASIC), programmable logic arrays (PLA)s, logical components, software routines, or other mechanisms might be implemented to make up a module. In implementation, the various modules described herein might be implemented as discrete modules or the functions and features described can be shared in part or in total among one or more modules. In other words, as would be apparent to one of ordinary skill in the art after reading this description, the various features and functionality described herein may be implemented in any given application and can be implemented in one or more separate or shared modules in various combinations and permutations. Even though various features or elements of functionality may be individually described or claimed as separate modules, one of ordinary skill in the art will understand that these features and functionality can be shared among one or more common software and hardware elements, and such description shall not require or imply that separate hardware or software components are used to implement such features or functionality.

While the invention has been particularly shown and described in conjunction with exemplary embodiments, it will be appreciated that variations and modifications will occur to those skilled in the art. For example, although the illustrative embodiments are described herein as a series of acts or events, it will be appreciated that the present invention is not limited by the illustrated ordering of such acts or events unless specifically stated. Some acts may occur in different orders and/or concurrently with other acts or events apart from those illustrated and/or described herein, in accordance with the invention. In addition, not all illustrated steps may be required to implement a methodology in accordance with the present invention.

Furthermore, the methods according to the present invention may be implemented in association with the formation and/or processing of structures illustrated and described herein as well as in association with other structures not illustrated. Therefore, it is to be understood that the appended claims are intended to cover all such modifications and changes that fall within the true spirit of the invention.

What is claimed is:

1. A method for forming a semiconductor device, comprising:
    forming a source-drain region, a replacement metal gate, and an inter-layer dielectric layer on a substrate;
    forming a stress nitride encapsulation layer over the replacement metal gate and the inter-layer dielectric layer;
    detecting a susceptible region for a potential defect in the semiconductor device between the metal gate and the source-drain region;
    etching a first portion of a contact trench to a source-drain region of the semiconductor device, the first portion of the contact trench extending to a depth that is below the susceptible region and above the source-drain region;
    depositing a dielectric liner in the trench, wherein a portion of the dielectric liner overlays the susceptible region; and
    etching a remainder of the contact trench channel to the source-drain region while leaving the portion of the dielectric liner that overlays the susceptible region.

2. The method of claim 1, further comprising:
    forming a hardmask layer for the etching of the first and second portions of the contact trench over the stress nitride encapsulation layer; and
    removing the hardmask layer using a chemical hardmask strip process,
    wherein the portion of the dielectric liner that overlays the susceptible region prevents the chemicals used in the chemical hardmask strip process from reaching the susceptible region.

3. The method of claim 2, wherein the hardmask layer comprises titanium nitride.

4. The method of claim 2, wherein the dielectric liner comprises a composition selected from a group, consisting of: silicon carbon oxide, silicon nitride, or silicon oxide.

5. The method of claim 2, wherein the susceptible region is located at a junction of the inter-layer dielectric layer and the stress nitride encapsulation layer.

6. The method of claim 5, wherein the potential defect is caused by a residue of material from formation of the metal gate left in the susceptible region by an incomplete planarization of the metal gate.

7. The method of claim 5, wherein the potential defect is caused by an interface flaw between the inter-layer dielectric layer and the adjoining stress nitride encapsulation layer.

8. The method of claim 1, wherein the metal gate is a replacement metal gate in a replacement metal gate transistor.

9. The method of claim 1, further comprising forming a contact to the source-drain region in the contact trench.

10. A semiconductor device, formed via a process, comprising:
    forming a source-drain region, a replacement metal gate, and an inter-layer dielectric layer on a substrate;
    forming a stress nitride encapsulation layer over the replacement metal gate and the inter-layer dielectric layer;
    detecting a susceptible region for a potential defect in the semiconductor device between the metal gate and the source-drain region;
    etching a first portion of a contact trench to a source-drain region of the semiconductor device, the first portion of the contact trench extending to a depth that is below the susceptible region and above the source-drain region;
    depositing a dielectric liner in the trench, wherein a portion of the dielectric liner overlays the susceptible region; and
    etching a remainder of the contact trench channel to the source-drain region while leaving the portion of the dielectric liner that overlays the susceptible region.

11. The semiconductor device of claim 10, further comprising:
    forming a hardmask layer for the etching of the first and second portions of the contact trench over the stress nitride encapsulation layer; and
    removing the hardmask layer using a chemical hardmask strip process, wherein the portion of the dielectric liner that overlays the susceptible region prevents the chemicals used in the chemical hardmask strip process from reaching the susceptible region.

12. The method of claim 11,
wherein the hardmask layer comprises titanium nitride, and
wherein the dielectric liner comprises a composition selected from a group, consisting of: silicon carbon oxide, silicon nitride, or silicon oxide.

* * * * *